United States Patent [19]
Fuse et al.

[11] Patent Number: 5,867,040
[45] Date of Patent: Feb. 2, 1999

[54] INTEGRATED CIRCUIT WITH STACKED SUB-CIRCUITS BETWEEN VCC AND GROUND SO AS TO CONSERVE POWER AND REDUCE THE VOLTAGE ACROSS ANY ONE TRANSISTOR

[75] Inventors: Tsuneaki Fuse, Tokyo; Yukihito Oowaki, Yokohama, both of Japan

[73] Assignee: Kabushiki Kaisha Toshiba, Kawasaki, Japan

[21] Appl. No.: 593,275

[22] Filed: Jan. 29, 1996

[30] Foreign Application Priority Data

Jun. 15, 1995 [JP] Japan ................................. 7-148838
Jan. 17, 1996 [JP] Japan ................................. 8-005877

[51] Int. Cl.$^6$ ........................... H03K 19/00; H01L 25/00
[52] U.S. Cl. ........................... 326/101; 326/62; 327/530; 307/24
[58] Field of Search ................................. 326/101, 121, 326/62; 307/18, 19, 24, 28; 327/530

[56] References Cited

U.S. PATENT DOCUMENTS

| | | | |
|---|---|---|---|
| 4,175,240 | 11/1979 | Kremlev et al. | 326/100 |
| 4,459,496 | 7/1984 | Yamada et al. | 326/100 |
| 4,471,241 | 9/1984 | Nagano | 326/100 |
| 4,659,942 | 4/1987 | Volp | 307/19 |
| 4,739,497 | 4/1988 | Itoh et al. | 365/230.06 |
| 5,067,003 | 11/1991 | Okamura | 327/530 |
| 5,270,581 | 12/1993 | Nakamura | 327/530 |
| 5,353,435 | 10/1994 | Kitagawa et al. | 395/555 |
| 5,581,506 | 12/1996 | Yamauchi | 365/203 |
| 5,638,013 | 6/1997 | Iwata et al. | 327/530 |

FOREIGN PATENT DOCUMENTS 59-60521 4/1984 Japan .
60-204117 10/1985 Japan .

OTHER PUBLICATIONS

Chen, John Y., "CMOS Devices and Technology For VLSI", copyright 1990 by Prentice–Hall, Inc., p. 277.
Wakerly, Johm F., "Digital Design Principles and Practices", copyright 1989 by John F. Wakerly, p. 236.
Daisaburo Takashima, et al. "Low–Power On–Chip Supply Voltage Conversion Scheme for Ultrahigh–Density DRAM'S", *IEEE Journal of Solid–State Circuits*, vol. 28, No. 4, Apr. 1993, pp. 504–509.

Primary Examiner—Michael J. Tokar
Assistant Examiner—Richard Roseen
Attorney, Agent, or Firm—Oblon, Spivak, McClelland, Maier & Neustadt, P.C.

[57] ABSTRACT

The semiconductor integrated circuit device of the present invention includes a plurality of integrated circuits. The scheduling circuit selects an arbitrary number of integrated circuit from the plurality of integrated circuits, and connects the selected integrated circuits between the power line and the ground line such that the selected integrated circuits are arranged in series or in series-parallel. The scheduling circuit sets a combination of connection of the selected integrated circuits such that the consumption power of the total of the selected integrated circuits becomes minimum. The voltage control circuit sets a potential of a serial connecting portion of the selected integrated circuits. The data control circuit has an input output circuit for inputting and outputting data between the selected integrated circuits, and the outside, and a level conversion circuit for converting a level of data between certain integrated circuits.

15 Claims, 11 Drawing Sheets

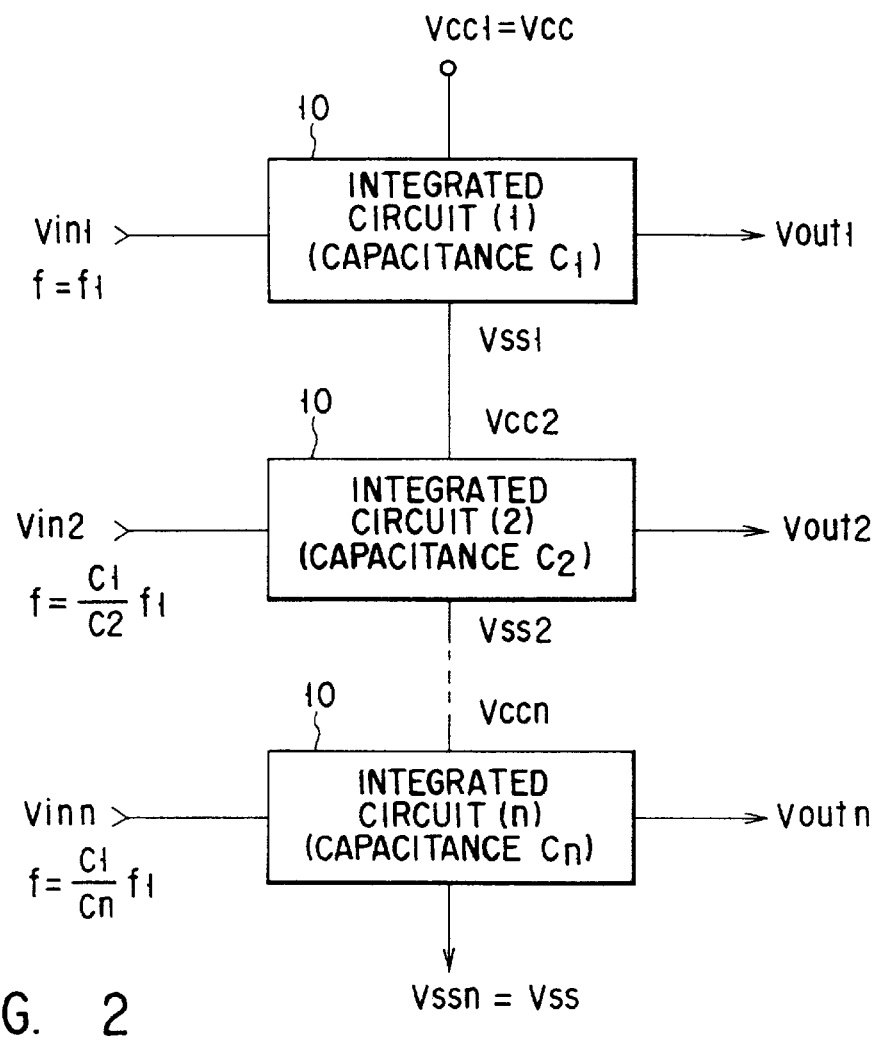
F I G. 2

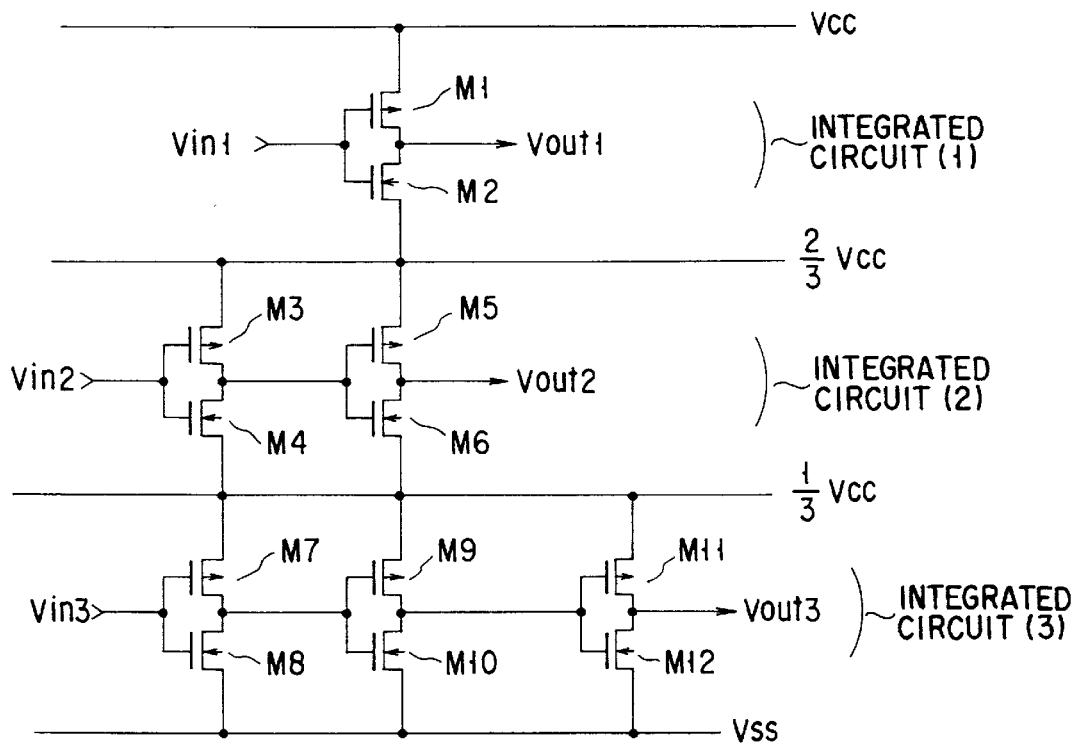
F I G. 4
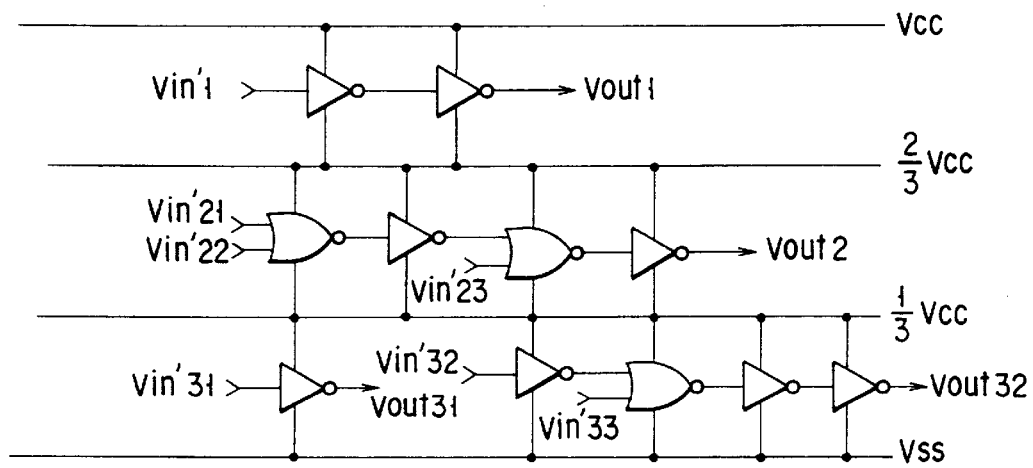
F I G. 6

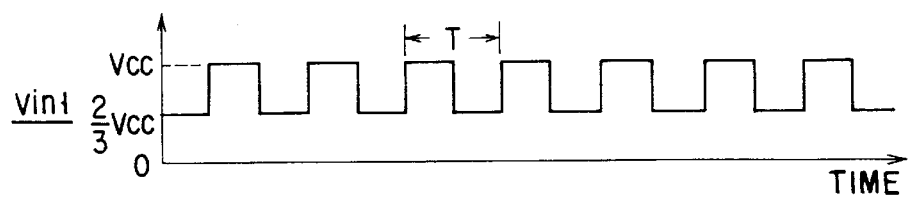
FIG. 9A
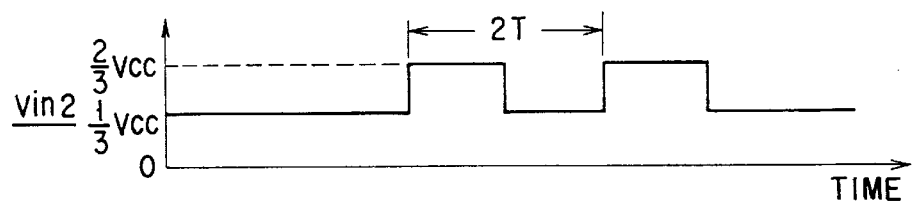
FIG. 9B
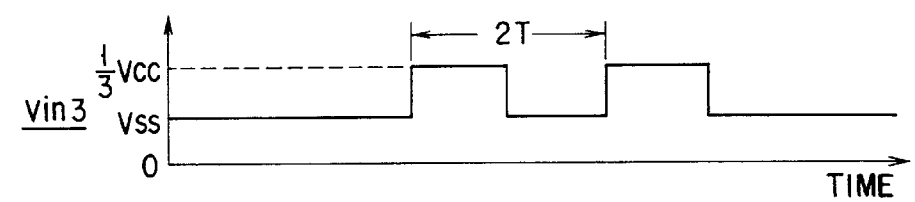
FIG. 9C
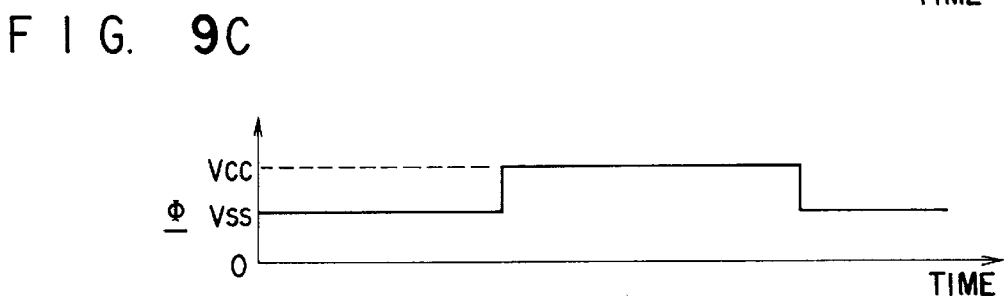
FIG. 9D
FIG. 9E

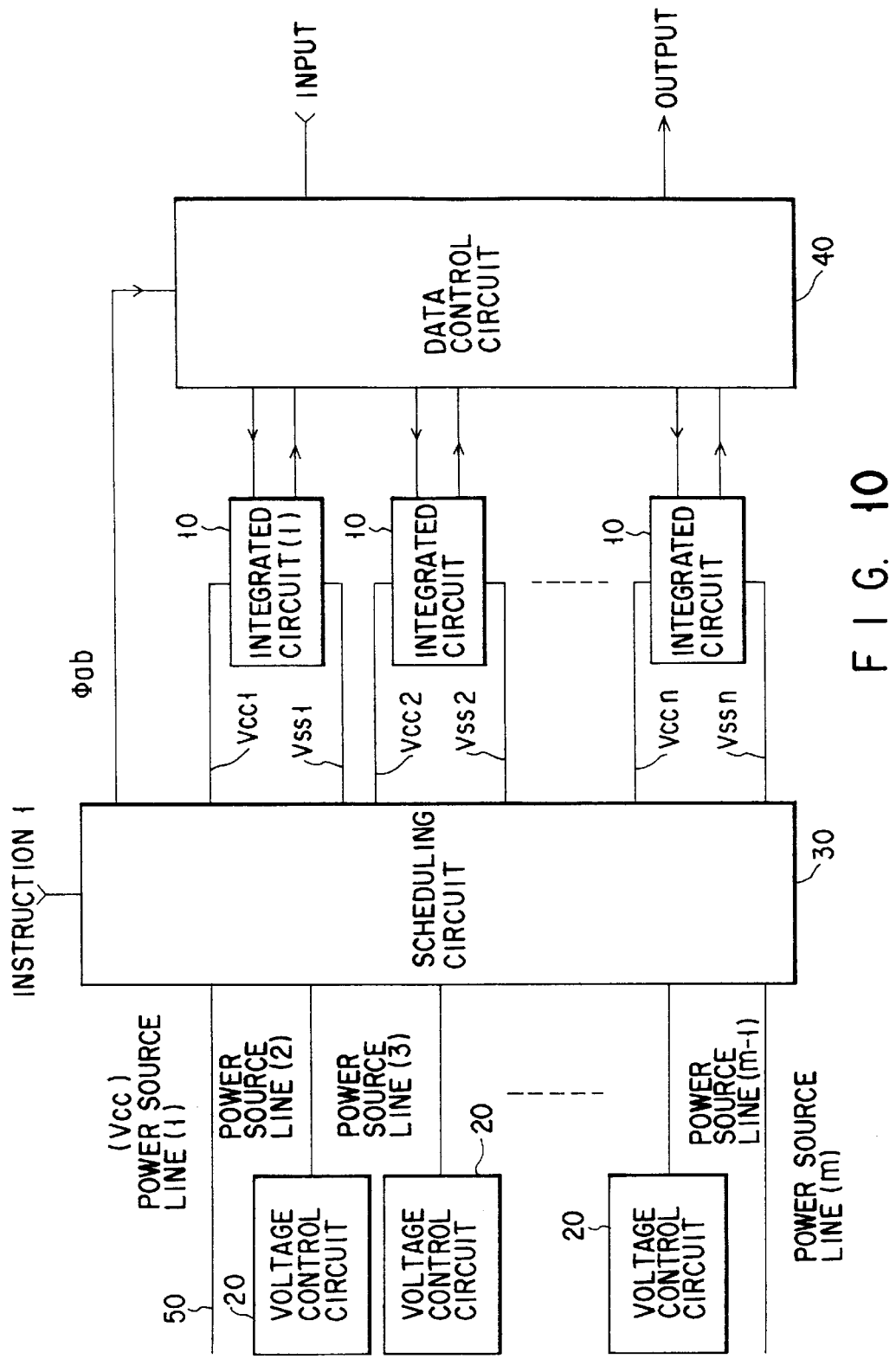
F I G. 10

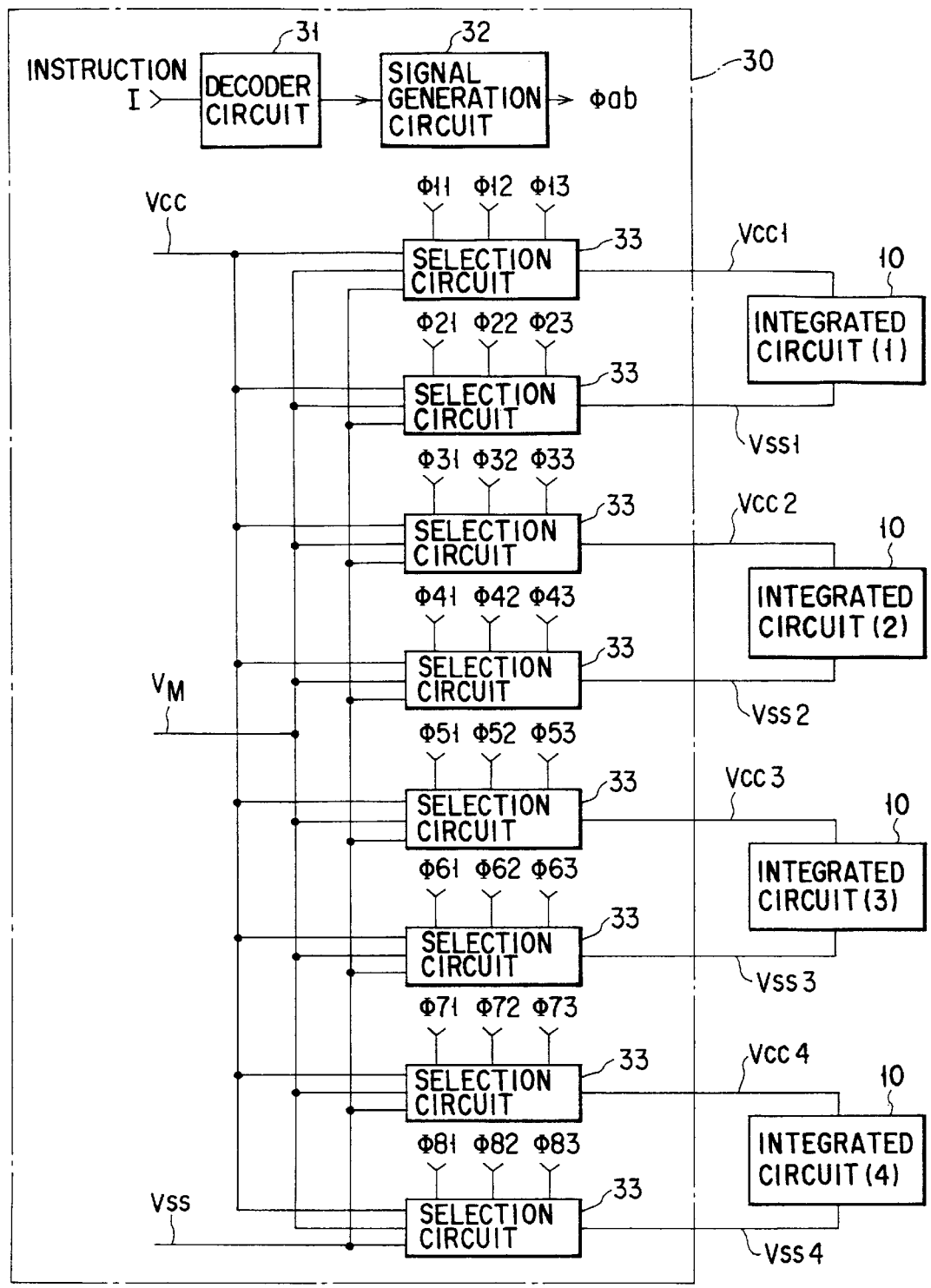
F I G. 11

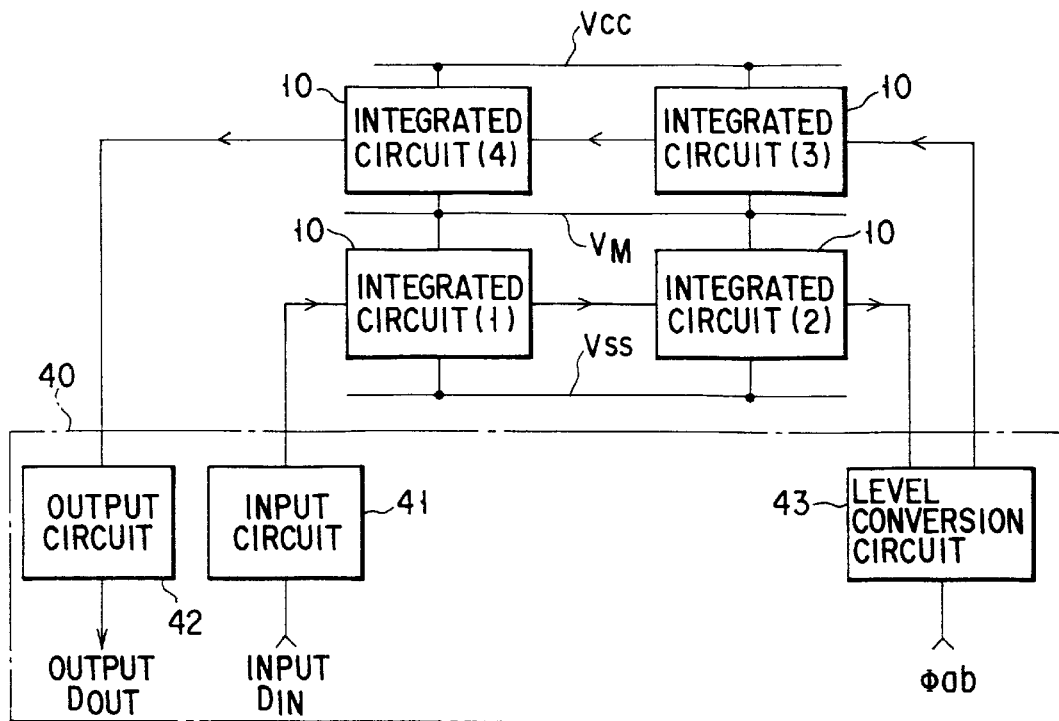
F I G. 12A
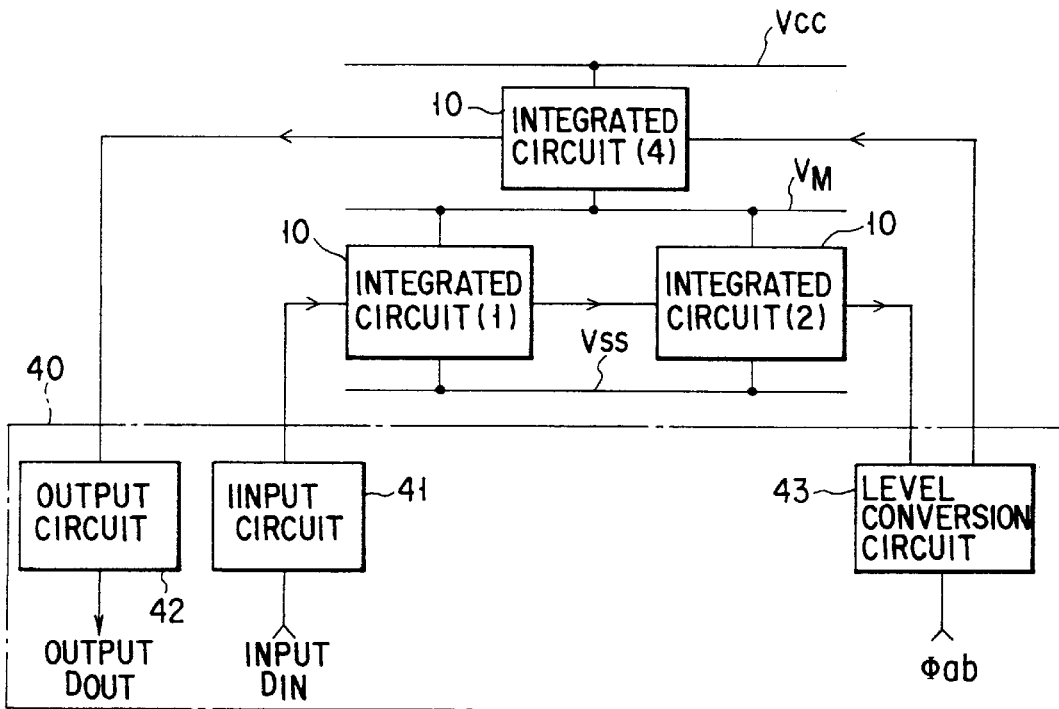
F I G. 12B

| INSTRUCTION ／ Φab | I1 | I2 | INSTRUCTION ／ Φab | I1 | I2 |
|---|---|---|---|---|---|
| Φ11 | L | L | Φ51 | H | L |
| Φ12 | H | H | Φ52 | L | L |
| Φ13 | L | L | Φ53 | L | L |
| Φ21 | L | L | Φ61 | L | L |
| Φ22 | L | L | Φ62 | H | L |
| Φ23 | H | H | Φ63 | L | L |
| Φ31 | L | L | Φ71 | H | H |
| Φ32 | H | H | Φ72 | L | L |
| Φ33 | L | L | Φ73 | L | L |
| Φ41 | L | L | Φ81 | L | L |
| Φ42 | L | L | Φ82 | H | H |
| Φ43 | H | H | Φ83 | L | L |

F I G. 13

INTEGRATED CIRCUIT WITH STACKED SUB-CIRCUITS BETWEEN VCC AND GROUND SO AS TO CONSERVE POWER AND REDUCE THE VOLTAGE ACROSS ANY ONE TRANSISTOR

BACKGROUND OF THE INVENTION

1. Field of the Invention

The present invention relates to a semiconductor integrated circuit device to which a plurality of integrated circuits such as, microprocessors, logic circuits and the like are connected in series.

2. Description of the Related Art

Recently, the degree of integration of an integrated circuit device has been significantly improved, and in a semiconductor memory of a giga (G) bit order, several hundred million elements are integrated in one chip. In a 64-bit microprocessor, several million to ten million elements are integrated in one chip. The improvement of the degree of the integration is achieved by downsizing the elements. In the case of a 1 G-bit DRAM (dynamic random access memory), MOS (metal oxide semiconductor) transistors having a gate length of 0.15 μm are used, and for a higher degree of integration, MOS transistors having a gate length of 0.1 μm or less are used.

In a MOS transistor of such a small size, deterioration of transistor characteristics occurs because of the generation of a hot carrier, or breakdown of insulation films occurs because of the TDDB (time dependent dielectric breakdown). Further, in the case where the concentration of impurities in a bulk or a channel portion is raised in order to suppress a decrease in threshold voltage caused by shortening of the channel length, the junction breakdown voltage between a source and a drain, is decreased.

In order to maintain the reliability of these fine elements, it is effective to decrease the supply voltage. More specifically, the generation of a hot carrier is avoided by weakening the electric field running in the lateral direction between the source and drain, and the TDDB is prevented by weakening the electric field running in the vertical direction between the gate and bulk. Further, by decreasing the supply voltage, a reverse bias acting on the junction between the source and the bulk or between the drain and the bulk, is decreased, thus making it possible to follow up a decrease in the junction breakdown voltage.

In the meantime, in a bipolar transistor, a high-speed operation can be achieved by shortening the base width; however if the base width is excessively shortened, the bipolar transistor cannot function as a transistor because of punch through. In order to avoid this, it is necessary to increase the concentration of impurities in the base. Further, if the current density is increased, the cutoff frequency is decreased. In order to avoid this so-called Kirk effect (or base pushout effect), it is necessary to increase the concentration of impurities in the collector.

In the downsized bipolar transistor, the concentration of the impurities in the base and the collector region must be increased, and with an increase in the concentration, the base-collector junction breakdown voltage is decreased. In order to avoid this, a decrease in the supply voltage is effective as in the case of the MOS transistor.

As described above, in the case where elements are downsized, it is necessary to decrease the supply voltage in order to maintain the reliability of the device; however, at the same time, the structure of the device is complicated for a user who actually deals with the semiconductor integrated circuit device (semiconductor chip), creating a problem. In other words, for a user, it is not preferable that the supply voltage should differ from one chip to another among a plurality of semiconductor chips. Further, it is not preferable that the supply voltage which has been used in the conventional structure should become unusable as it is.

Recently, a device as shown in FIG. 1, in which the supply voltage is decreased within a semiconductor chip, has been proposed. In this device, a voltage down converter 111 and an integrated circuit 110 are connected in series between a power line (supply voltage Vcc) and a ground line (ground voltage Vss), thus maintaining the voltage applied to the integrated circuit 110 at Vcc' which is lower than Vcc. With use of the voltage down converter 111, the reliability of the semiconductor chip is increased.

However, in a device of the above-described type, the power consumed in the voltage down converter 111 is wastefully used. Therefore, it is difficult to achieve a power-saving performance of the semiconductor chip as a whole, creating a new problem. For example, in the case where supply voltage Vcc=3 V and the voltage applied to the integrated circuit 110 is 1.5 V, a subtracted voltage difference of 1.5 V is applied to the voltage down converter 111, and thus a half of the total consumption power is used in the voltage down converter 111.

More specifically, the consumption power P of a semiconductor chip as a whole is expressed by $P=CV^2f$, where V indicates the difference between the supply voltage and the ground voltage, C indicates the capacitance between the power sources of the semiconductor chip, and f indicates the operation frequency. In FIG. 1, if the capacitance between the power sources of the voltage down converter 111 and the capacitance between the power sources of the integrated circuit 110 are both equal to C1, an equation, Vcc'=Vcc/2, is established. Therefore, the power consumed in the semiconductor chip as a whole is $(C1)V^2f$ and the power consumed in the voltage down converter 111 is $(C1/2)V^2f$. Thus, one half of the consumption power of the semiconductor chip as a whole is consumed by the voltage down converter 111.

For the purpose of suppressing the consumption of the power in a voltage down converter, the following device has been proposed (Jap. Pat. Appln. KOKAI Publication No. H4-3153131). According to this technique, two integrated circuits are connected in series between the power line and the ground line, and the current flowing through the first integrated circuit is recycled in the second integrated circuit. Further, a voltage control circuit is connected to a power line within the semiconductor chip, which is a connection portion between the first and second integrated circuits, so as to maintain a voltage of the power line in the chip at constant.

In this device, however, if the first and second integrated circuits do not function at the same time, the load on the voltage control circuit is increased. Therefore, a voltage control circuit having a drive capability as large as that of the voltage down converter is required. As a result, the consumption power cannot be decreased.

As described above, conventionally, in a semiconductor integrated circuit device employing fine elements, a voltage down converter is used in order to maintain the reliability of the device and to avoid the complexity of the structure; however, the power consumed in such a voltage down converter is wasted.

Meanwhile, in a device in which a plurality of integrated circuits are connected in series without using a voltage down converter, the drive capability of the internal voltage control circuit must be enhanced when these integrated circuits are not operated at the same time. As a result, the power substantially the same as that consumed in a voltage down converter when the voltage down converter is used, is consumed by the voltage control circuit, and such power is wastefully used.

SUMMARY OF THE INVENTION

An object of the present invention is to provide a semiconductor integrated circuit capable of decreasing a voltage applied to an integrated circuit without decreasing the supply voltage or using a voltage down converter, thus decreasing the consumption power.

Another object of the present invention is to provide a semiconductor integrated circuit device capable of decreasing a voltage applied to an integrated circuit without enhancing the drive capability of the voltage control circuit even if a plurality of integrated circuits are not operated at the same time, thus decreasing the consumption power.

According to the first aspect of the present invention, there is provided a semiconductor integrated circuit device comprising a plurality of integrated circuits connected between a power line and a ground line; and means for performing one of (i) setting an input signal frequency for each of the plurality of integrated circuits and (ii) establishing a connection relationship in which the plurality of integrated circuits are arranged in series or in series-parallel, such that serial connecting portion of the plurality of integrated circuits has a predetermined potential.

In the device, the plurality of integrated circuits may be commonly formed on an insulation film of a substrate.

According to the second aspect of the invention, there is provided a semiconductor integrated circuit device comprising a plurality of integrated circuits connected in series between a power line and a ground line, wherein input signal frequencies are set respectively such that products of electrical capacitances of the plurality of integrated circuits and the input signal frequencies are equal to each other.

In the device, it is preferable that voltage differences of the plurality of integrated circuits should be equal to each other.

Further, a structure of at least one of the plurality of integrated circuits may be different from that of another circuit. An electric capacitance of at least one of the plurality of integrated circuits may be different from that of another circuit. The plurality of integrated circuits may include CMOS inverters. At least one of the plurality of integrated circuits may include CMOS inverters having plural stages. At least one of the plurality of integrated circuits may include at least one of an inverter circuit, a NAND circuit and a NOR circuit.

The device may include a voltage down converter capable of switching at least one of the plurality of integrated circuits between an operation state and a standby state. In this case, the application of a voltage between the power line and the ground line is off while the voltage down converter is driven. Those integrated circuits which are in an operation state while the voltage down converter is driven, are supplied with a voltage by means of the voltage down converter.

The device may include the first switching circuit for turning on/off the application of voltage between the power line and the ground line; and the second switching circuit, which operates complementarily with the operation of the first switching circuit, for turning on/off driving of the voltage down converter.

According to the third aspect of the present invention, there is provided a semiconductor integrated circuit device comprising a plurality of integrated circuits; and a scheduling circuit for selecting an arbitrary number of integrated circuit from the plurality of integrated circuit, and connecting the selected integrated circuits between a power line and a ground line such that the selected integrated circuits are arranged in series or in series-parallel.

In the device, it is preferable that the scheduling circuit should serve to set a combination of connection of the selected integrated circuits such that a consumption power of a total of the selected integrated circuits becomes minimum. The scheduling circuit may serve to a combination of connection of the selected integrated circuits such that serial connecting portions of the selected integrated circuits have potentials obtained by equally dividing a difference between a potential at the power line and a potential at the ground line. The scheduling circuit may be designed to operate in accordance with an instruction from outside.

It is preferable that the device further include a voltage control circuit for setting a potential of a serial connecting portion of the selected integrated circuits. In this case, it is preferable that the scheduling circuit should include a plurality of selection circuits for setting a relationship of connection between the selected integrated circuits and the voltage control circuit.

The device may further include an instruction means for giving an instruction which indicates those integrated circuits to be selected and the content of the combination thereof, to the scheduling circuit. Further, the device may further include a memory medium, which is referred to by the instruction means, for storing the content of the combination by which a consumption power becomes minimum, with regard to integrated circuits which can be variously selected.

The device may further include an input output circuit for inputting and outputting data between the selected integrated circuits, and outside. The device may further include a level conversion circuit for converting a level of data between certain integrated circuits.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a block diagram showing the structure of a semiconductor integrated circuit device according to the first embodiment;

FIG. 4 is a block diagram showing the structure of a semiconductor integrated circuit device according to the second embodiment;

FIG. 6 is a block diagram showing the structure of a semiconductor integrated circuit device according to the third embodiment;

FIGS. 9A to 9E are diagrams each showing a change in input signal along with time, and a clock of each of the integrated circuits in the microprocessor shown in FIG. 8;

FIG. 10 is a block diagram showing the structure of a semiconductor integrated circuit device according to the fifth embodiment;

FIG. 11 is a diagram showing an example of the structure of the scheduling circuit shown in FIG. 10;

FIGS. 12A and 12B are diagrams each showing an example of the structure of the data control circuit shown in FIG. 10; and FIG. 13 is a table showing a relationship between a signal Φab for selecting a necessary one of the integrated circuits shown in FIG. 10, and an instruction I.

DETAILED DESCRIPTION OF THE PREFERRED EMBODIMENTS

Figure 1:
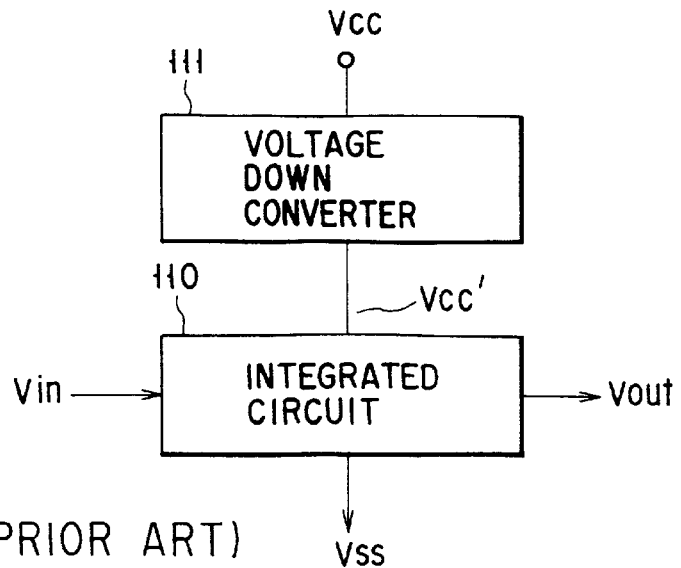
FIG. 1 is a block diagram showing an example of the structure of a conventional device employing an voltage down converter.

Embodiments of the present invention will now be described with reference to drawings.
(First Embodiment)

FIG. 2 is a block diagram showing a semiconductor integrated circuit device (semiconductor chip) according to the first embodiment of the present invention. As shown in this figure, n number ($n \leq 2$) of integrated circuits 10 (that is, an integrated circuit (1) to an integrated circuit (n)) are connected in series between a power line (supply voltage Vcc) and a ground line (ground voltage Vss). The integrated circuits receive signals Vin1, Vin2, . . . , Vinn, respectively and output signals Vout1, Vout2, . . . , Voutn.

Let us now suppose that a supply voltage applied to an integrated circuit (1) is Vcc1 (=Vcc), a ground voltage thereof is Vss1, a supply voltage applied to an integrated circuit (2) is Vcc2 (=Vss1), a ground voltage thereof is Vss2, a supply voltage applied to an integrated circuit (n) is Vccn (=Vssn−1), and a ground voltage thereof is Vssn (=Vss). Further, capacitances between power sources of integrated circuits, Vcc1 and Vss1, Vcc2 and Vss2, . . . , Vccn and Vssn are assigned as C1, C2, . . . , Cn.

If the frequency of a signal Vin1 input to the integrated circuit (1) is assigned as f1, an average value I1 of currents flowing in the integrated circuit (1) is given by:

$$I1 = f1 \cdot C1(Vcc1 - Vss1) \quad (1)$$

Let us assume that an average value of currents flowing to the integrated circuits (2) to (n) is equal to I1, the following relationship can be established for the voltage between terminals of each of the integrated circuits.

$$V = Vcc1 - Vss1 = Vcc2 - Vss2 = Vccn - Vssn \quad (2)$$

In the case where V is defined as in this equation, and the frequency of a signal Vin2 input to the integrated circuit (2) is set as $f=(C1/C2)f1$, an average current I2 is given by:

$$I2 = (C1/C2)f1 \leq C2\ V \quad (3)$$

which is equal to I1. Similarly, in the case where the frequency of a signal Vinn input to an integrated circuit (n) is set as $f=(C1/Cn)f1$, an average current In is given by:

$$In = (C1/Cn)f1 \cdot Cn \cdot V \quad (4)$$

which is equal to I1. That is, equation (2) is established by appropriately selecting the frequency of an input signal.

Figure 3A:
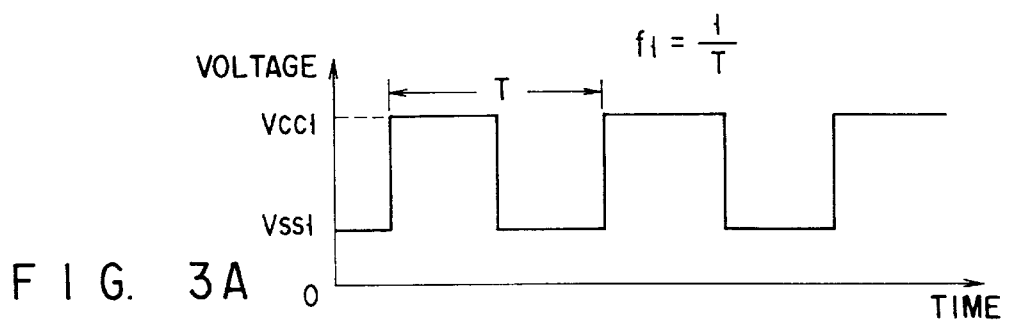
FIGS. 3A to 3D are diagrams each showing a change in input signal along with time, and a current of each of the integrated circuits in the semiconductor integrated circuit device shown in FIG. 2.
Figure 3B:
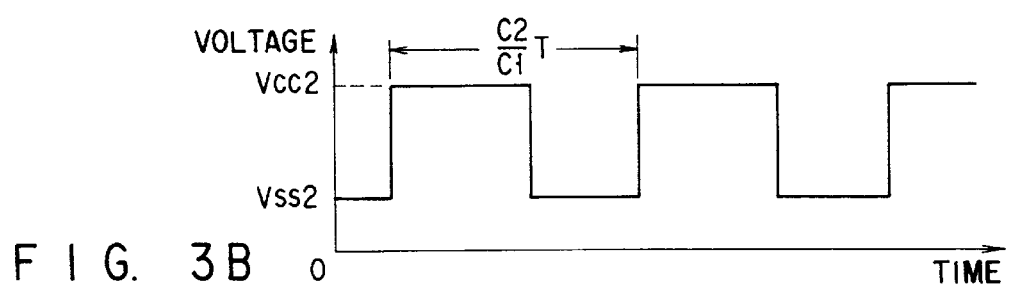
Figure 3C:
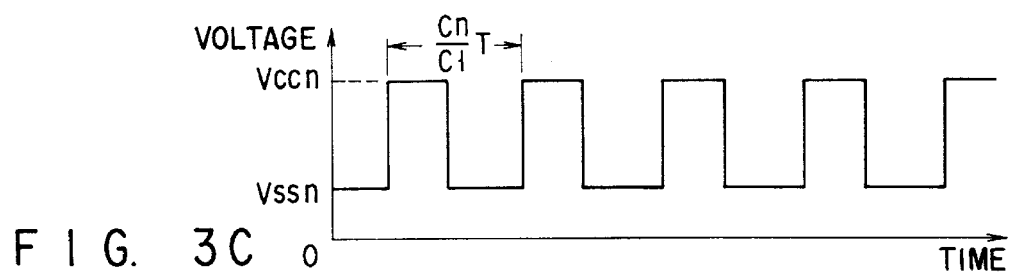
Figure 3D:
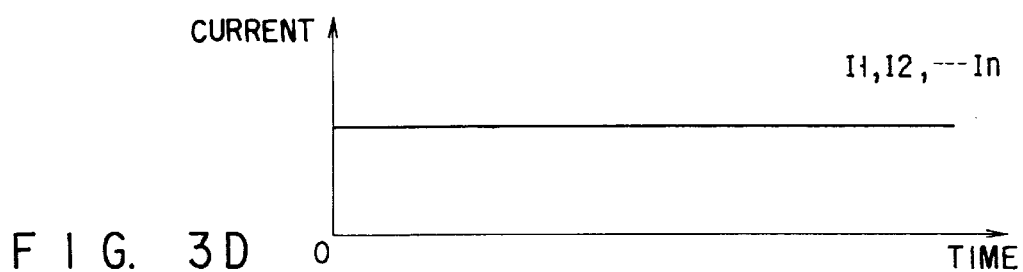

FIG. 3A shows a change in Vin1 along with time, FIG. 3B shows a change in Vin2 along with time, FIG. 3C shows a change in Vinn along with time, and FIG. 3D shows a change in I1, I2 and In along with time. Since the cycle of a signal is an inverse number of the frequency of the signal, when f1=1/T, the cycle of the signal input to the integrated circuit (2) is (C2/C1) T, and the cycle of the signal input to the integrated circuit (n) is (Cn/C1) T.

From the equation (2), the differences between the supply voltages and the ground voltages in the integrated circuits are equal to each other and the average values of the flowing currents are equal to each other; therefore the powers P consumed by the integrated circuits are equal to each other. Consequently, the total power consumed by all of the n number of the integrated circuits is P watts×n.

Conventionally, in order to uniform the reliabilities of the elements with regard to, for example, an integrated circuit (n), the integrated circuits (1) to (n−1) are replaced by voltage down converters. In this case, the power consumed by the voltage down converters is (n−1)×P watts. Consequently, for the n number of integrated circuits, a total power of n×(n−1)×P watts is consumed by all of the voltage down converters. Therefore, with the present invention, the consumption power can be reduced to the level expressed by the equation below, as compared to the conventional technique:

$$(n \times P)/\{n \times P + n \times (n-1) \times P\} = 1/n \quad (5)$$

As described above, according to the first embodiment, the n number of integrated circuits (1) to (n) are connected between the power line and the ground line in series, and the value of each of input signal frequencies f is set such that the products of the capacitances C of the integrated circuits and the input signal frequencies f become all the same. In this manner, the voltage applied to each integrated circuit can be decreased without lowering the supply voltage as a whole or employing a voltage down converter. Thus, the reliability of the fine element can be maintained and the consumption power can be reduced.
(Second Embodiment)

FIG. 4 is a block diagram showing a semiconductor integrated circuit device (semiconductor chip) according to the second embodiment of the present invention. The second embodiment is an example in which the integrated circuits (1) to (n) of the first embodiment are constituted by CMOS inverters. Therefore, when n=3, it is the case where the semiconductor integrated circuits are constituted by three integrated circuits (1) to (3).

An integrated circuit (1) between a power line (Vcc) and (⅔) Vcc is a one-stage CMOS inverter consisting of MOS transistors M1 and M2. An integrated circuit (2) between (⅔) Vcc and (⅓) Vcc is a two-stage CMOS inverter consisting of MOS transistors M3 to M6. An integrated circuit (3) between (⅓) Vcc and a ground line (Vss) is a three-stage CMOS inverter consisting of MOS transistors M7 and M12.

Let us suppose that the capacitances between power sources of the integrated circuits (1) to (3) are C1, C2 and C3, respectively, and the frequencies of the input signals Vin1, Vin2 and Vin3 are f1, f2 and f3, respectively. Further, supposing that the CMOS inverters are made of MOS transistors of the same size, the following relationships are established. That is, C2=2C1 and C3=3C1. Therefore, when the frequencies are set so as to satisfy f2=(½)f1 and f3=(⅓)f1, the average currents I flowing in the integrated circuits (1) to (3) becomes the same, thus satisfying the following relation ship.

$$I = f1 \cdot C1 \cdot Vcc/3 \qquad (6)$$
$$= f2 \cdot C2 \cdot Vcc/3$$
$$= f2 \cdot C2 \cdot Vcc/3$$

Figure 5A:
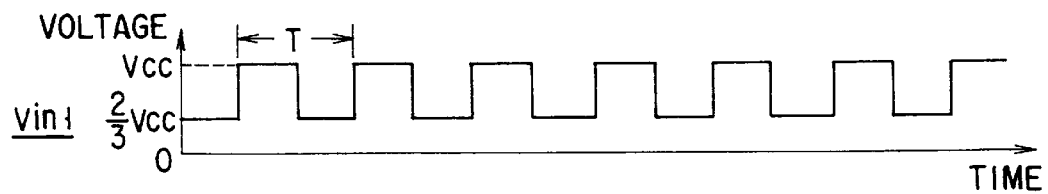
FIGS. 5A to 5C are diagrams each showing a change in input signal along with time, of each of the integrated circuits in the semiconductor integrated circuit device shown in FIG. 4.
Figure 5B:
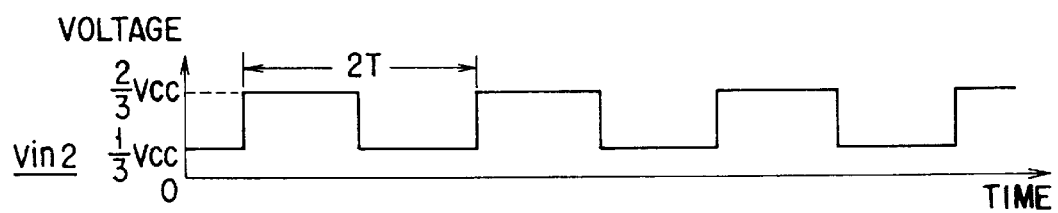
Figure 5C:
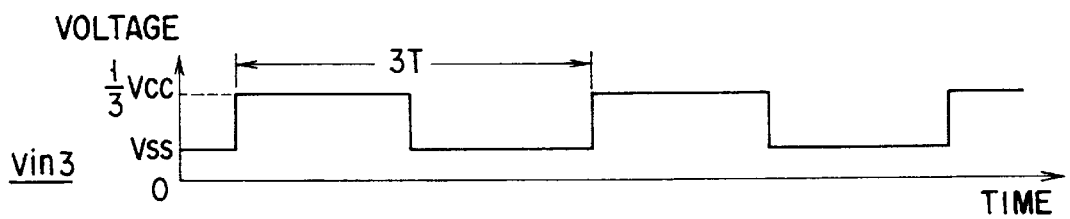

FIGS. 5A to 5C show the waveforms of the input signals of the above case. FIG. 5A shows a change in Vin1 along with time, FIG. 5B shows a change in Vin2 along with time, and FIG. 5C shows a change in Vin3 along with time. As can be understood from the figures, the cycle of Vin2 is two times as long as the cycle T of Vin1 and the cycle of Vin3 is three times as long as the cycle T.

Supposing that the power source Vcc of the semiconductor chip is 3 V and the ground voltage Vss=0 V, the voltage applied to the fine elements in each integrated circuit is 1 V, thus making it possible to maintain a sufficient reliability. Further, the consumption power becomes ⅓ as compared to the case where a voltage down converter is used.

In this embodiment, three integrated circuits made of, for example, CMOS inverter circuits, are provided between Vcc and Vss, and input signals are input to each integrated circuit one at a time; however some other structure is acceptable as long as the products of the capacitances C and the frequencies f are equal to each other.

(Third Embodiment)

FIG. 6 is a block diagram showing a semiconductor integrated circuit device (semiconductor chip) according to the third embodiment of the present invention. The third embodiment is an example in which the integrated circuits of the first embodiment are constituted by inverter circuits, NAND circuits and NOR circuits in combination. Therefore, when n=3, it is the case where the semiconductor integrated circuits are constituted by three integrated circuits (1) to (3).

As in the embodiments described, when the frequencies of the input signals Vin are set such that the average currents I are equal to each other, the consumption power of the semiconductor chip can be reduced while maintaining the reliability of the fine element.

(Fourth Embodiment)

Figure 7:
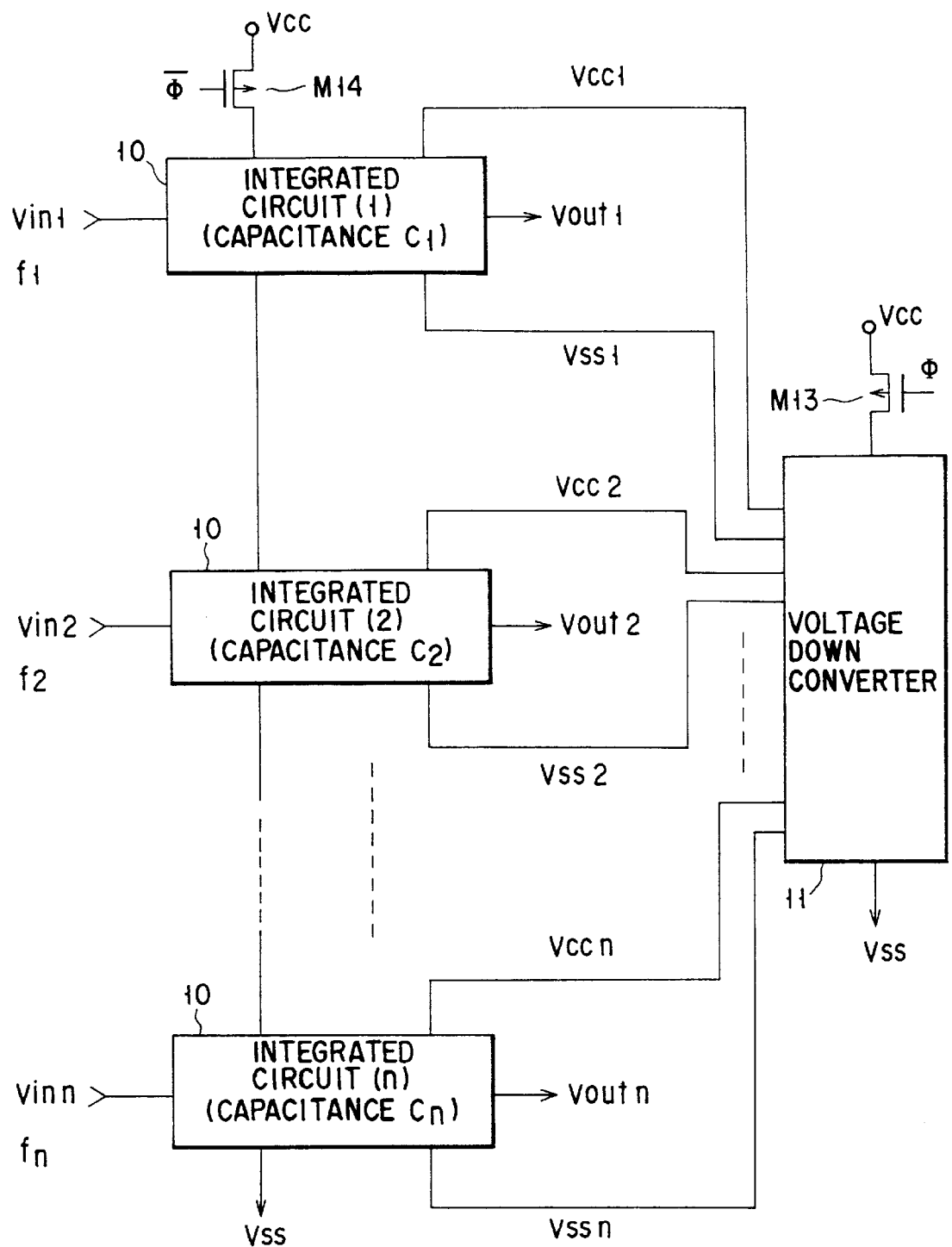
FIG. 7 is a block diagram showing the structure of a semiconductor integrated circuit device according to the fourth embodiment.

FIG. 7 is a block diagram showing a semiconductor integrated circuit device (semiconductor chip) according to the fourth embodiment of the present invention. The differences between the fourth embodiment and the first embodiment are that a voltage down converter 11 is connected between a power line (power source voltage Vcc) and a ground line (ground voltage Vss) via a switching transistor M13, that an integrated circuit (1) is connected to a power line via a switching transistor M14, and that integrated circuits (1) to (n) are connected to partial voltage output ends of the voltage down converter 11.

Figure 8:
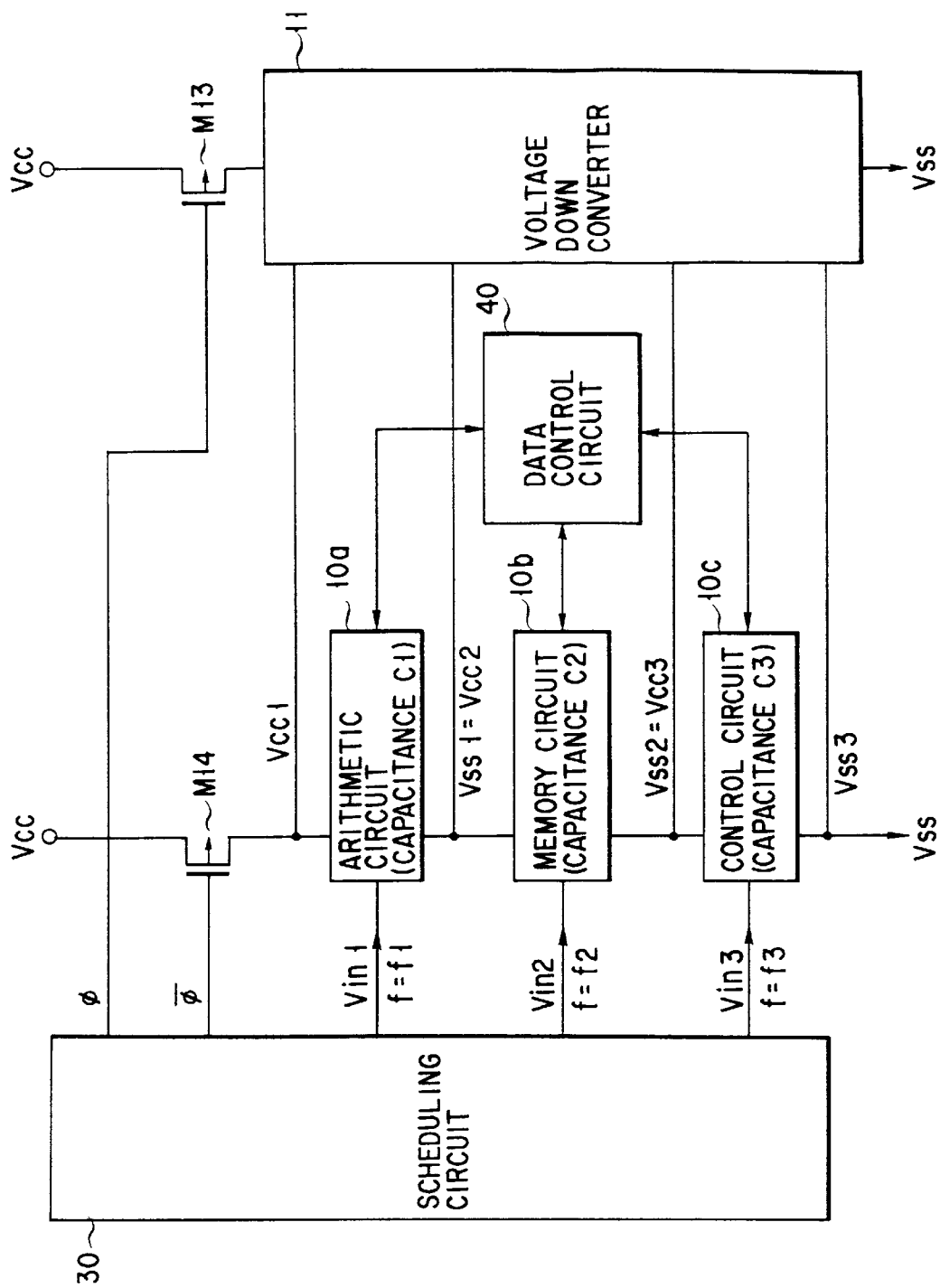
FIG. 8 is a block diagram showing the structure of a microprocessor according to the fourth embodiment.

FIG. 8 is a block diagram showing a structure of a microprocessor constituted by an arithmetic circuit 10a, a memory circuit 10b and a control circuit 10c corresponding to the above integrated circuit (1) to (3) respectively, in the case where n=3. The scheduling circuit 30 outputs the clock φ and φ⁻ for controlling the switching transistors M13 and M14, and outputs the input signals Vin1, Vin2 and Vin3 having frequencies f1, f2 and f3, respectively. Further, a data control circuit 40 having a buffer circuit and a level conversion circuit (not shown) are provided, in which data-sending/receiving among the arithmetic circuit 10a, the memory circuit 10b and the control circuit 10c is performed.

FIG. 9A shows a waveform of an input signal Vin1 of the arithmetic circuit 10a of this microprocessor. FIG. 9B shows a waveform of an input signal Vin2 of the memory circuit 10b. FIG. 9C shows a waveform of an input signal Vin3 of the control circuit 10c. FIG. 9D shows a waveform of a clock φ for controlling the switching transistor M13. FIG. 9E shows a waveform of a clock φ⁻ for controlling the switching transistor M14.

The frequency f1 of the input signal Vin1 is 1/T, and the arithmetic circuit 10a is operated at this frequency all the time. Meanwhile, the memory circuit 10b and the control circuit 10c are operated only between times t1 and t2, and the frequencies f2 and f3 of the input signals are both ½T (f2=f3=½T). The clock φ has a high level between times t1 and t2 and a low level at other times, that is, 0 to t1 and t2 or later. The clock φ⁻ is an inversion of the clock φ.

When the switching transistors M13 and M14 are constituted by p-MOS transistors, M13 is turned on between times 0 and t1 since the clock φ is at the low level, and the voltage down converter 11 is operated. Further, since the clock φ⁻ is at the high level, M14 is turned off, and the supply of the supply voltage Vcc via the M14 is stopped. However, voltages Vcc1=Vcc, and Vss1=(⅔)Vcc are applied to the integrated circuit (1), that is, the arithmetic circuit 10a, by the voltage down converter 11, voltages Vcc2=(⅔) Vcc, and Vss2=(⅓)Vcc are applied to the integrated circuit (2), that is, the memory circuit 10b, and voltages Vcc3=(⅓) Vcc, and Vss3=Vss are applied to the integrated circuit (3), that is, the control circuit 10c. Thus, the arithmetic circuit 10a is operated, and the other circuits are set in a standby state.

At this point, the integrated circuits (2) and (3) are in the standby state, no substantial current flows in the integrated circuit (2) or (3), but a current flows through the integrated circuit (1) and the voltage down converter 11. Therefore, according to the fourth embodiment, even if the integrated circuits (2) and (3) are in the standby state, only the integrated circuit (1) can be selectively operated. It should be noted that if it is not necessary to apply a voltage of a certain level to the integrated circuits (2) and (3) in the standby state, the application of the voltage from the voltage down converter 11 to the circuits (2) and (3) can be omitted.

Between the times t1 and t2, the clock φ is at the high level, and therefore M13 is turned off and the voltage down converter 11 is not operated. In other words, Vcc1, Vss1, Vcc2, Vss2, Vcc3 and Vss3 from the voltage down converter 11 are not supplied. Meanwhile, the clock φ⁻ is at the low level, and therefore M14 is turned on, and each of the integrated circuits (1) to (3) is operated as in the case of the first embodiment, making it possible to avoid the wasteful power consumption.

Next, for a time t2 or later, the clock φ is at the low level and the clock φ⁻ is at the high level, the memory circuit 10b and the control circuit 10c is again set in the standby state.

As described, according to the fourth embodiment, the consumption power can be saved when the integrated circuits (1) to (3) connected in series are operated as in the first embodiment, and only one integrated circuit can be selectively operated in accordance with necessity.

(Fifth Embodiment)

FIG. 10 is a block diagram showing a semiconductor integrated circuit device (semiconductor chip) according to the fifth embodiment of the present invention. The device of this embodiment consists of the n number of integrated circuits 10 (namely, circuits (1) to (n)) having different functions from each other, an m-2 number (m is the number of power source lines 50) of voltage control circuits 20 for controlling voltages of the m-2 number of power source lines 50, at constant, of the m number of power source lines 50 (namely, power source lines (1) to (m)), a power line (Vcc) and a ground line (Vss) being eliminated, a scheduling circuit 30 for determining a connection of integrated circuits 10, and a data control circuit 40 for sending or receiving data between the integrated circuits 10 and with regard to the outside.

To the semiconductor integrated circuit device of the fifth embodiment, an instruction I is input from outside. In the case of a memory such as DRAM, the instruction I assigns an operation mode from write, read, refresh, high-speed page mode, nibble mode, static column mode and the like. In the case of a microprocessor, the instruction I assigns transfer of data, comparison, saving, addition, subtraction, multiplication, division and the like.

In the scheduling circuit 30, the instruction I is decoded, and a signal Φab used for selecting a necessary integrated circuit 10 is formed. Further, by means of the signal Φab, the k number ($2 \leq k \leq n$) of integrated circuits which are necessary are selected from the integrated circuits (1) to (n) ($n \geq 2$), and the power line Vcci and the ground line Vssi of a selected integrated circuit (i) ($i \leq k-1$) are connected to the power source lines (1) to (m) ($3 \leq m \leq n+1$) in series-parallel such that the consumption power becomes the minimum ($1 \leq a \leq 2n$, $1 \leq b \leq m$).

The data control circuit 40 consists of an input/output circuit for sending or receiving data with respect to the outside and a level conversion circuit for passing data between the selected integrated circuits (1) to (k). The power source line (1) is connected to Vcc, and the line (m) is connected to Vss. Further, the power source line (2) to the line (m-1) have voltages between Vcc and Vss, and the voltage difference between the lines (i) and (i+1) is a result of the voltage difference between Vcc and Vss equally divided by m-1. Furthermore, a voltage control circuit 20 is connected to each of the power source lines (2) to (m-1).

FIG. 11 is an example of the structure of the scheduling circuit 30 when n=4 and m=3. The circuit 30 consists of a decoder circuit 31 for decoding the instruction I, a signal generating circuit 32 for forming a signal Φab and a selection circuit 33. In the signal generation circuit 32, it is decided whether the signal Φab is set at a high level or low level based on the data stored in a ROM (Read Only Memory) or the like in advance. In the selection circuit 33, one of the power source voltage Vcc, the intermediate voltage Vm and the ground voltage Vss of the semiconductor chip, which should be connected to the power source voltage Vcci and the ground voltage Vssi of the integrated circuits (1) to (4) is selected on the basis of the signal Φab. For example, when Φ11 is at the high level, and Φ12 and Φ13 are at the low level, Vcc1 is connected to Vcc, or when Φ22 is at the high level, and Φ21 and Φ23 are at the low level, Vss1 is connected to Vm. With regard to a non-selected integrated circuit, all of Φab's are set at the low level, and the power line and ground line of the integrated circuit are connected to the same power source line.

FIGS. 12A and 12B show examples of the structure of the data control circuit 40 in the case where Φab is scheduled with respect to two instructions I1 and I2. As in the case shown in FIG. 11, it is supposed that n=4 and m=3. FIG. 12A shows the case of the instruction I1 and FIG. 12B shows the case of the instruction I2.

As shown in FIG. 13, in the case of the instruction I1, Φ12 and Φ23 are set at the high level and Φ11, Φ13, Φ21 and Φ22 are set at the low level, and therefore the integrated circuit (1) is connected between Vm and Vss. Similarly, Φ32 and Φ43 are set at the high level and Φ31, Φ33, Φ41 and Φ42 are set at the low level, and therefore the integrated circuit (2) is connected between Vm and Vss. Further, Φ51 and Φ62 are set at the high level and Φ52, Φ53, Φ61 and Φ63 are set at the low level, and therefore the integrated circuit (3) is connected between Vcc and Vm. Similarly, Φ71 and Φ82 are set at the high level and Φ72, Φ73, Φ81 and Φ83 are set at the low level, and therefore the integrated circuit (4) is connected between Vcc and Vm. More specifically, as can be seen in FIG. 12A, the integrated circuits (1) to (4) are connected in series-parallel between Vcc and Vss.

While maintaining the above state, the input circuit 41 is connected to the integrated circuit (1), and thus input data DIN is input from the outside and an output from the circuit (1) is input to the circuit (2). An output from the circuit (2) is input to the circuit (3). In order to match the input and output levels with each other, the level conversion circuit 43 is provided. An output from the circuit (3) is input to the circuit (4), and an output from the circuit (4) is output to outside as output data Dout via an output circuit 42. At this point, an integrated circuit connected to the level conversion circuit 43 is selected on the basis of the signal Φab.

Next, in the case of the instruction I2, Φ12 and Φ23 are set at the high level and Φ11, Φ13, Φ21 and Φ22 are set at the low level, and therefore the integrated circuit (1) is connected between Vm and Vss. Similarly, Φ32 and Φ43 are set at the high level and Φ31, Φ33, Φ41 and Φ42 are set at the low level, and therefore the integrated circuit (2) is connected between Vm and Vss. Further, Φ51, Φ52, Φ53, Φ61, Φ62 and Φ63 are all set at the low level, and therefore the integrated circuit (3) is not connected to a power source line. Similarly, Φ71 and Φ82 are set at the high level and Φ72, Φ73, Φ81 and Φ83 are set at the low level, and therefore the integrated circuit (4) is connected between Vcc and Vm. More specifically, as can be seen in FIG. 12B, the integrated circuits (1), (2) and (4) are connected in series-parallel between Vcc and Vss, and the circuit (3) is not connected.

It should be noted that, in order not to select the integrated circuit (3), Φ51 and Φ61 should be set at the high level and Φ52, Φ53, Φ62 and Φ63 should be set at the low level, or Φ52 and Φ62 should be set at the high level and Φ51, Φ53, Φ61 and Φ63 should be set at the low level, or Φ53 and Φ63 should be set at the high level and Φ51, Φ52, Φ61 and Φ62 should be set at the low level.

While maintaining the above state, the input circuit 41 is connected to the integrated circuit (1), and thus input data DIN is input from the outside and an output from the circuit (1) is input to the circuit (2). An output from the circuit (2) is input to the circuit (4). In order to match the input and output levels with each other, the level conversion circuit 43 is provided. An output from the circuit (4) is output to outside as output data DOUT via an output circuit 42. At this point, an integrated circuit connected to the level conversion circuit 43 is selected on the basis of the signal Φab.

In the above-described embodiment, a plurality of integrated circuits are connected in series-parallel; however it suffices only if at least a part contains a connection in series, or all of the selected integrated circuits are connected all in series.

As described, according to the fifth embodiment, the combination of integrated circuits connected in series or in series-parallel, between the power line (Vcc) and the ground line (Vss), can be freely changed in accordance with an instruction input from outside. With this structure, not all of the integrated circuits have to be operated at the same time, but only those of the integrated circuits which should be operated at the same are connected in series or in series-parallel, thus making it possible to reduce the voltage applied to each integrated circuit without varying the supply voltage for the semiconductor chip as a whole.

In other words, the combination by which the consumption power becomes minimum is scheduled for each instruction, thus making it possible to save the consumption power. Further, it is not necessary to provide a voltage control circuit having a drive capability as large as that of the voltage down converter, for a non-operating integrated circuit, and therefore the consumption power of the voltage control circuit can be reduced, thus making it possible to further save the consumption energy.

Moreover, the fifth embodiment is particularly effective for the case where serial data is input/output by a pipe line process, or a microprocessor by a pipe line process. In other words, by selecting circuits which are operated in a pipe line manner on the basis of an instruction, a plurality of integrated circuits which are connected in series-parallel between the power source voltage and the ground voltage can be operated at the same time all the time, thus achieving a semiconductor integrated circuit device of an effectively low consumption power.

The present invention is not limited to the embodiments described above. The integrated circuits, the voltage down converters or the like in each embodiment may be of separate semiconductor chips; however the present invention is still effective even if all these are made in one semiconductor chip.

In this case, the substrate regions of the MOS transistors included in the integrated circuits connected in series-parallel are different in units of the integrated circuits. For example, the MOS transistor formed on the insulation layer on the silicon substrate is applicable for the present invention because the substrate regions of the MOS transistors are different in units of elements.

Further, the structure of the integrated circuits is not limited at all to those discussed above, but can be changed appropriately in accordance with specification. Or the present invention can be remodeled into different versions as long as the essence of the present invention remains.

As described in detail, according to the present invention, a plurality of integrated circuits are connected in series between the power line and the ground line, and the input signal frequencies are set respectively such that the products of the capacitances between powers of the circuits and the input signal frequencies are equal to each other. Therefore, the voltage applied to a fine element within an integrated circuit can be reduced without lowering the supply voltage applied to the semiconductor chip, thus making it possible to improve the reliability of the element and reduce the consumption power.

According to the present invention, the combination of integrated circuits connected in series or in series-parallel, between the power line (Vcc) and the ground line (Vss), can be freely changed in accordance with an instruction input from outside. The combination by which the consumption power becomes minimum is scheduled for each instruction, thus making it possible to save the consumption power.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
a plurality of integrated circuits connected in series between a power line and a ground line, wherein each of said plurality of integrated circuits holds a predetermined electrical capacitance between its connecting portions, and input signal frequencies are set respectively such that products of electrical capacitances of said plurality of integrated circuits and the input signal frequencies are equal to each other; and
a voltage down converter capable of switching at least one of said plurality of integrated circuits between an operation state and a standby state,
wherein application of a voltage between the power line and the ground line is off while said voltage down converter is driven.

2. A device according to claim 1, wherein those integrated circuits which are in an operation state while said voltage down converter is driven, are supplied with a voltage by means of said voltage down converter.

3. A semiconductor integrated circuit device comprising:
a plurality of integrated circuits connected in series between a power line and a ground line, wherein each of said plurality of integrated circuits holds a predetermined electrical capacitance between its connecting portions, and input signal frequencies are set respectively such that products of electrical capacitances of said plurality of integrated circuits and the input signal frequencies are equal to each other;
a voltage down converter capable of switching at least one of said plurality of integrated circuits between an operation state and a standby state;
a first switching circuit for turning on/off the application of voltage between the power line and the ground line; and
a second switching circuit, which operates complemnentarily with the operation of said first switching circuit, for turning on/off driving of said voltage down converter.

4. A semiconductor integrated circuit device comprising:
a plurality of integrated circuits; and
a scheduling circuit for selecting an arbitrary number of integrated circuits from said plurality of integrated circuits, and connecting said selected integrated circuits between a power line and a ground line, the connection of said selected integrated circuits being changeable between a series connection and a series-parallel connection in accordance with an input instruction.

5. A device according to claim 4, wherein said scheduling circuit executes the selection and connection of said plurality of integrated circuits such that a consumption power of a total of the selected integrated circuits becomes minimum.

6. A device according to claim 4, wherein said scheduling circuit executes the selection and connection of said plurality of integrated circuits such that serial connecting portions of the selected integrated circuits have potentials obtained by equally dividing a difference between a potential at the power line and a potential at the ground line.

7. A device according to claim 4, wherein said scheduling circuit operates in accordance with an instruction from outside.

8. A device according to claim 4, further comprising a voltage control circuit for setting a potential of a serial connecting portion of the selected integrated circuits.

9. A device according to claim 8, wherein said scheduling circuit includes a plurality of selection circuits for setting a relationship of connections between said selected integrated circuits and said voltage control circuit.

10. A device according to claim 4, further comprising instruction means for giving an instruction which indicates the selection and connection of said plurality of integrated circuits, to said scheduling circuit.

11. A device according to claim 4, further comprising an input output circuit for inputting and outputting data between the selected integrated circuits, and outside.

12. A device according to claim 11, further comprising a level conversion circuit for converting a level of data between certain integrated circuits.

13. A semiconductor integrated circuit device comprising:
- a plurality of integrated circuits connected in series between a power line and a ground line, wherein each of said plurality of integrated circuits holds a predetermined electrical capacitance between its connecting portions, and input signal frequencies are set respectively such that products of electrical capacitances of said plurality of integrated circuits and the input signal frequencies are equal to each other; and
- a voltage down converter capable of switching at least one of said plurality of integrated circuits between an operation state and a standby state,
- wherein said plurality of integrated circuits are commonly formed on an insulation film of a substrate.

14. A semiconductor integrated circuit device comprising:
- a plurality of integrated circuits connected in series between a power line and a ground line, wherein each of said plurality of integrated circuits holds a predetermined electrical capacitance between its connecting portions, and input signal frequencies are set respectively such that products of electrical capacitances of said plurality of integrated circuits and the input signal frequencies are equal to each other; and
- a data control circuit which converts the levels of data input from or data output to said plurality of integrated circuits.

15. A device according to claim 14, wherein said plurality of integrated circuits are commonly formed on an insulation film of a substrate.

\* \* \* \* \*